(12) United States Patent
Hongo et al.

(10) Patent No.: US 7,777,314 B2
(45) Date of Patent: Aug. 17, 2010

(54) ELECTRONIC COMPONENT MOUNTING PACKAGE AND PACKAGE ASSEMBLED SUBSTRATE

(75) Inventors: Masanori Hongo, Hirakata (JP); Masami Fukuyama, Higashiosaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 8 days.

(21) Appl. No.: 11/374,138

(22) Filed: Mar. 14, 2006

(65) Prior Publication Data

US 2006/0220205 A1    Oct. 5, 2006

(30) Foreign Application Priority Data

Mar. 16, 2005    (JP) .............. 2005-075145

(51) Int. Cl.
*H01L 23/02*    (2006.01)
(52) U.S. Cl. ............ 257/678; 257/680; 257/701; 257/703; 257/E23.042
(58) Field of Classification Search ......... 257/678, 257/686, 666, 772, 779, 778, E23.02, E23.023, 257/E23.049, E25.031, 685, 81, 99, 680, 257/701, 703, 705
See application file for complete search history.

(56) References Cited

U.S. PATENT DOCUMENTS 5,291,038 A    3/1994    Hanamoto et al.
6,953,952 B2 *   10/2005   Asakawa ............ 257/103
7,505,275 B2 *   3/2009    Reis et al. ............ 361/717
2002/0185718 A1 *  12/2002   Mikubo et al. ....... 257/678

FOREIGN PATENT DOCUMENTS

| JP | 6-34275 U | 6/1994 |
|---|---|---|
| JP | 10-223817 A | 8/1998 |
| JP | 2002-232017 | 8/2002 |
| JP | 2002-232017 A | 8/2002 |
| JP | 2004-281994 A | 7/2004 |

OTHER PUBLICATIONS

Chinese Office Action dated Sep. 12, 2008, issued in corresponding Chinese Application No. 200610006494X.
Japanese Unexamined Patent Publication dated Mar. 16, 2010 issued in corresponding Japanese patent Application No. 2005-075145.

* cited by examiner

*Primary Examiner*—Davienne Monbleau
*Assistant Examiner*—Hoa B Trinh
(74) *Attorney, Agent, or Firm*—Westerman, Hattori, Daniels & Adrian, LLP (57) ABSTRACT

A package of the present invention has a laminate structure formed by laminating a plurality of ceramic layers, and has a mount surface to be a joint surface when mounted on a mother board, defined parallel with the laminating direction. A first ceramic layer has a recess with an L-shaped cross section across the mount surface and a side surface, defined at each end thereof in a direction perpendicular to the laminating direction, and an external electrode formed on each recess, the external electrode having a surface thereof exposed to the mount surface.

7 Claims, 10 Drawing Sheets

ELECTRONIC COMPONENT MOUNTING PACKAGE AND PACKAGE ASSEMBLED SUBSTRATE

The priority application Number 2005-075145 upon which this patent application is based is hereby incorporated by reference.

BACKGROUND OF THE INVENTION

1. Field of the Invention

The present invention relates to an electronic component mounting package having a laminate structure of a plurality of ceramic layers, and to a package assembled substrate, which is an intermediate product thereof.

2. Description of Related Art

Figure 12:
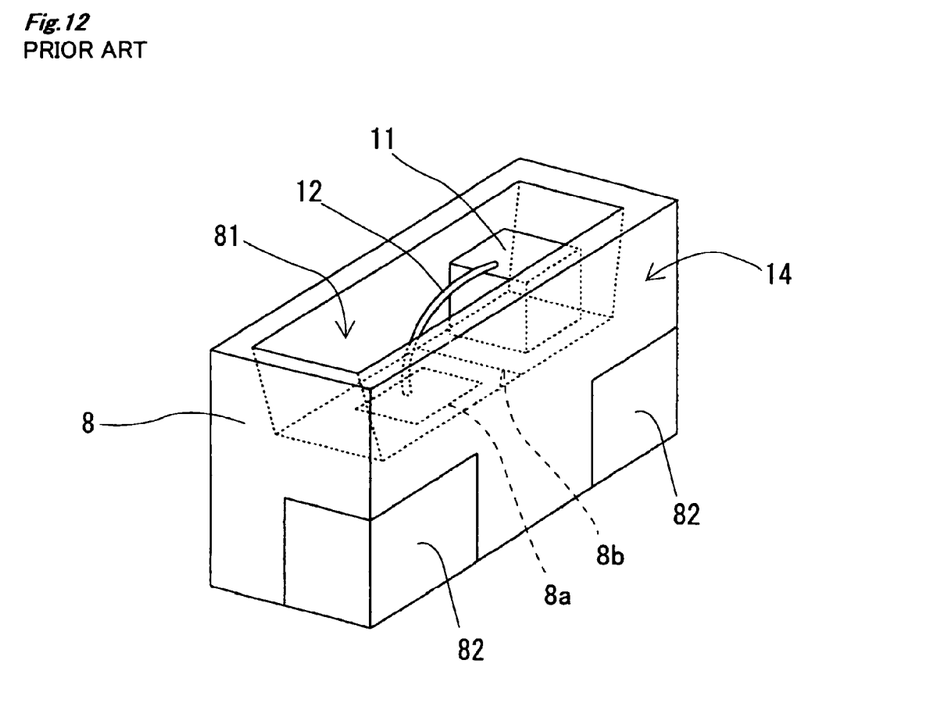
FIG. 12 is a perspective view of a conventional light emitting device.

A light emitting device as shown in FIG. 12 has been conventionally known in which a light emitting element 11 such as an LED is mounted in a package 8 formed by laminating a plurality of ceramic layers (JP 2002-232017, A). The package 8 is provided with a cavity 81 for housing the light emitting element 11. A first land layer 8a and a second land layer 8b are formed with a conductive material such as silver on the bottom surface of the cavity 81. A power supply terminal (not shown) provided on the top surface of the light emitting element 11 is connected to the first land layer 8a via a wire 12, while a ground terminal (not shown) provided on the reverse surface of the light emitting element 11 is connected to the second land layer 8b.

The package 8 has a mount surface 14 to be a joint surface when mounted on a mother board, defined on a side surface thereof parallel with the depth direction of the cavity 81. A pair of external electrodes 82, 82 for connecting the light emitting element 11 to an external circuit on the mother board are formed on the mount surface 14. The first land layer 8a and second land layer 8b are connected to the pair of external electrodes 82, 82 via a via hole (not shown).

The above-described light emitting device is mounted on the mother board with the mount surface 14 of the package 8 being opposed to a surface of the mother board, i.e., with the opening direction of the cavity 81 of the package 8 (light emitting direction of the light emitting element) being parallel with the mother board.

There has been known a specific structure of a pair of external electrodes to be formed on a package for the light emitting device as described above, in which, as shown in FIG. 13(a), FIG. 13(b) and FIG. 13(c), a through hole extending along the laminating direction of ceramic layers constituting a package 83 is provided at each end of a mount surface 14 of the package 83, and then a film of a conductive material such as silver is formed on the inner peripheral surface of the through hole to provide an external electrode 84.

Figure 13:
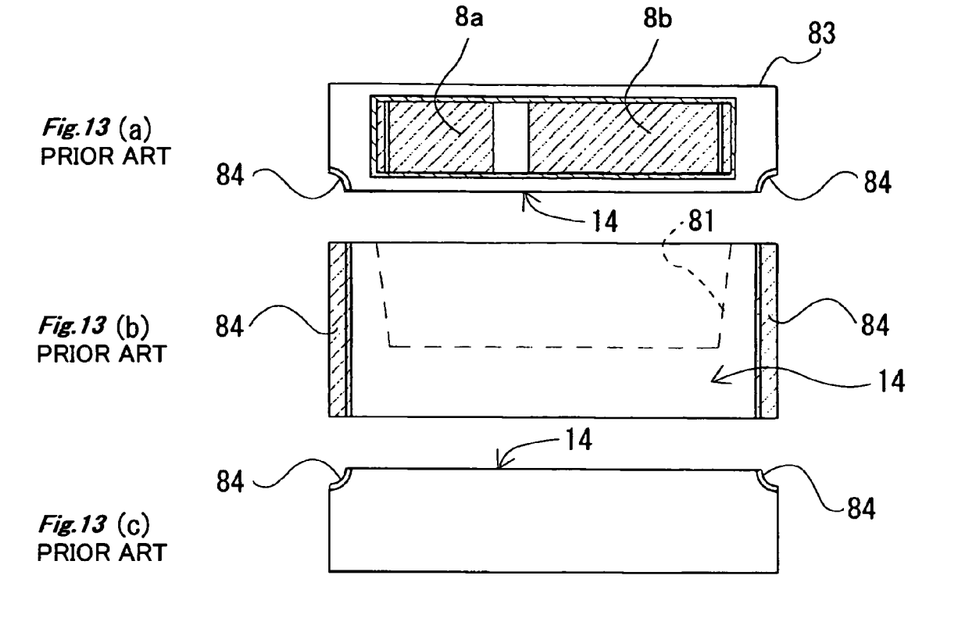

However, in a mounting structure with the external electrode 84 shown in FIG. 13(a), FIG. 13(b) and FIG. 13(c), the area of the external electrode 84 exposed to the mount surface 14, i.e., mounting area is extremely small. Therefore, there has been a problem of the package 83 shifting during a process for mounting the light emitting device on a mother board with solder reflow.

Figure 14:
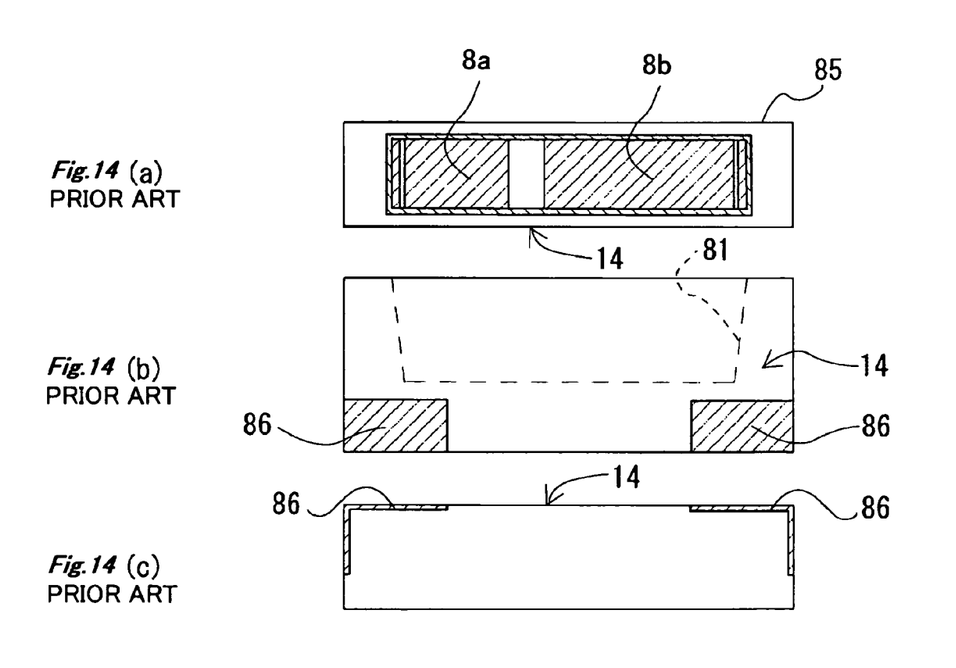

Accordingly, as shown in FIG. 14(a), FIG. 14(b) and FIG. 14(c), it is possible to form a layer of a conductive material such as silver at each end of a package 85 across a mount surface 14 and a side surface perpendicular to the mount surface 14 to provide an external electrode 86 with an L-shaped cross section. According to a mounting structure with the external electrode 86, the area of the external electrode 86 exposed to the mount surface 14, i.e., mounting area can be formed sufficiently large. This can suppress a shift of the package 85 during solder reflow.

In a manufacturing process for the package 85 shown in FIG. 14(a), FIG. 14(b) and FIG. 14(c), a package assembled substrate with a plurality of packages to be cut out therefrom is produced, and thereafter the package assembled substrate is cut by a dicer. In this process, a conductive material such as silver to provide the external electrode 86 of each package 85 will also be cut together by a dicer. Therefore, there has been a problem of burrs or the like occurring on cut surfaces to provide a surface of the external electrode 86 with poor flatness.

SUMMARY OF THE INVENTION

An object of the present invention is to provide an electronic component mounting package and a package assembled substrate, in which a flat surface and a sufficiently large mounting area can be obtained for a pair of external electrodes.

An electronic component mounting package of the present invention has a laminate structure formed by laminating a plurality of ceramic layers, and has a component mounting surface for mounting at least one electronic component, defined perpendicularly to a laminating direction, and a mount surface to be a joint surface when mounted on a mother board, defined parallel with the laminating direction.

At least one ceramic layer of the plurality of ceramic layers has a recess with an L-shaped cross section across the mount surface and a side surface perpendicular to the mount surface, defined at each end thereof in a direction perpendicular to the laminating direction, and an external electrode for connecting the electronic component to the mother board, formed on each recess, the external electrode having a surface thereof exposed to the mount surface. The external electrode has a width corresponding to a thickness of the one ceramic layer. Each recess has a depth greater than a thickness of the external electrode.

According to the above-described electronic component mounting package of the present invention, the exposed area of the external electrode in the mount surface can be enlarged depending on width of the L-shaped recess. This can suppress a shift of the package when mounted. Each external electrode may include a first electrode layer expanding parallel with the mount surface in a predetermined depth from the mount surface, and a second electrode layer expanding parallel with the side surface in a predetermined depth from the side surface. In this case, in a surface-mounting process using solder, a solder base portion is formed between the first electrode layer and a surface of the mother board, while a solder fillet portion is formed covering the second electrode layer, which provides a great joint strength.

A package assembled substrate of the present invention is an intermediate product of the above-described electronic component mounting package of the present invention, capable of having a plurality of electronic component mounting packages to be cut out therefrom, and has a laminate structure formed by laminating a plurality of ceramic layers, with an assembled structure in which each package part in the form of a rectangular parallelepiped to be one electronic component mounting package is arranged in the form of a matrix.

Each package part has a component mounting surface for mounting at least one electronic component, defined perpendicularly to a laminating direction; a recess with an L-shaped cross section perpendicular to the laminating direction, defined at each end of at least one ceramic layer of a plurality of ceramic layers constituting one package part in a direction perpendicular to the laminating direction, opposed to two neighboring package parts in two directions; and an external electrode for connecting the electronic component to a mother board, formed on each recess. Each recess has a depth greater than a thickness of the external electrode. A plurality of package parts can be cut out by cutting along a cutting line separate from the external electrode.

Specifically, at least one ceramic layer of a plurality of ceramic layers constituting four package parts assembled around an intersection of two orthogonal cutting lines is provided with a cross-shaped groove extending from the intersection along the two cutting lines, and the cross-shaped groove defines L-shaped recesses of the four package parts.

According to the above-described package assembled substrate of the present invention, a plurality of package parts can be cut out by cutting along a cutting line separate from the external electrode. Therefore, in a cutting process for the assembled substrate with a dicer, a conductive material to provide the external electrode of each package will not be cut together by a dicer.

As described above, according to the electronic component mounting package and the package assembled substrate of the present invention, a flat surface can be obtained for a pair of external electrodes, and a sufficiently large mounting area can also be obtained. Therefore, a package mounting an electronic component can be mounted on an accurate position of a mother board with a sufficient strength.

BRIEF DESCRIPTION OF THE DRAWINGS

FIG. 5(*a*), FIG. 5(*b*) and FIG. 5(*c*) are a plan view, a side view and a bottom view, respectively, of the package;

FIG. 8(*a*) and FIG. 8(*b*) represent a third step in the manufacturing process for the package;

FIG. 13(*a*), FIG. 13(*b*) and FIG. 13(*c*) are a plan view, a side view and a bottom view, respectively, of an electrode structure in a conventional package; and FIG. 14(*a*), FIG. 14(*b*) and FIG. 14(*c*) are a plan view, a side view and a bottom view, respectively, of another electrode structure in a conventional package.

DETAILED DESCRIPTION OF THE INVENTION

Figure 2:
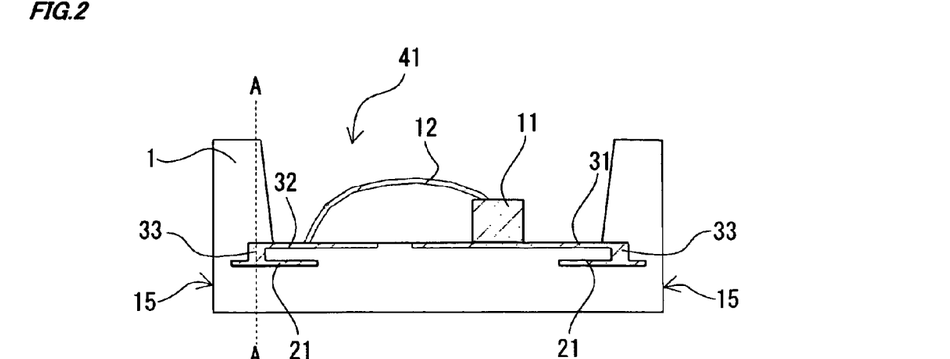
FIG. 2 is a longitudinal sectional view of a light emitting device.
Figure 11:
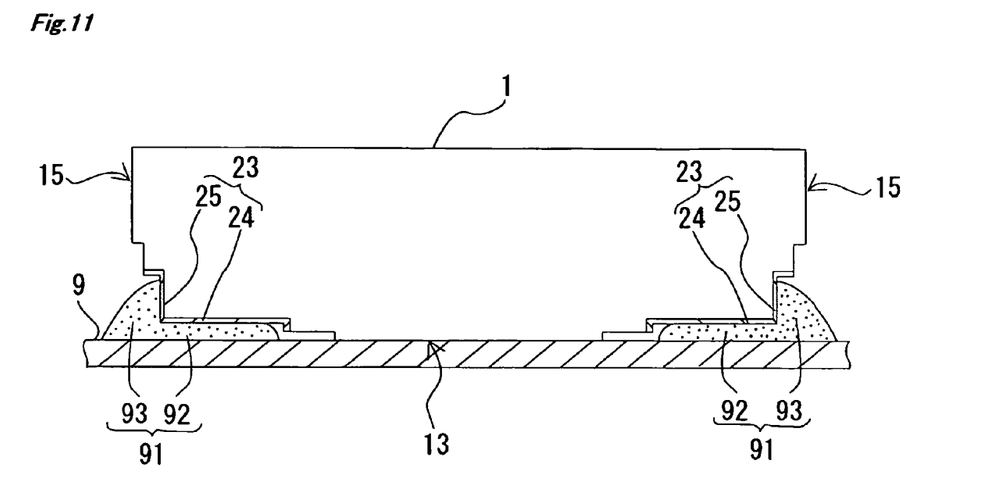
FIG. 11 is a sectional view showing a mounted state of the package.

The present invention carried out in a light emitting device will be specifically described below with reference to the drawings. As shown in FIG. 2, the light emitting device of the present invention has a light emitting element 11, made of an LED, mounted on a surface of a package 1, and is placed, when mounted on a mother board 9 as shown in FIG. 11, such that the light emitting direction of the light emitting element 11 is parallel with a surface of the mother board 9.

Figure 1:
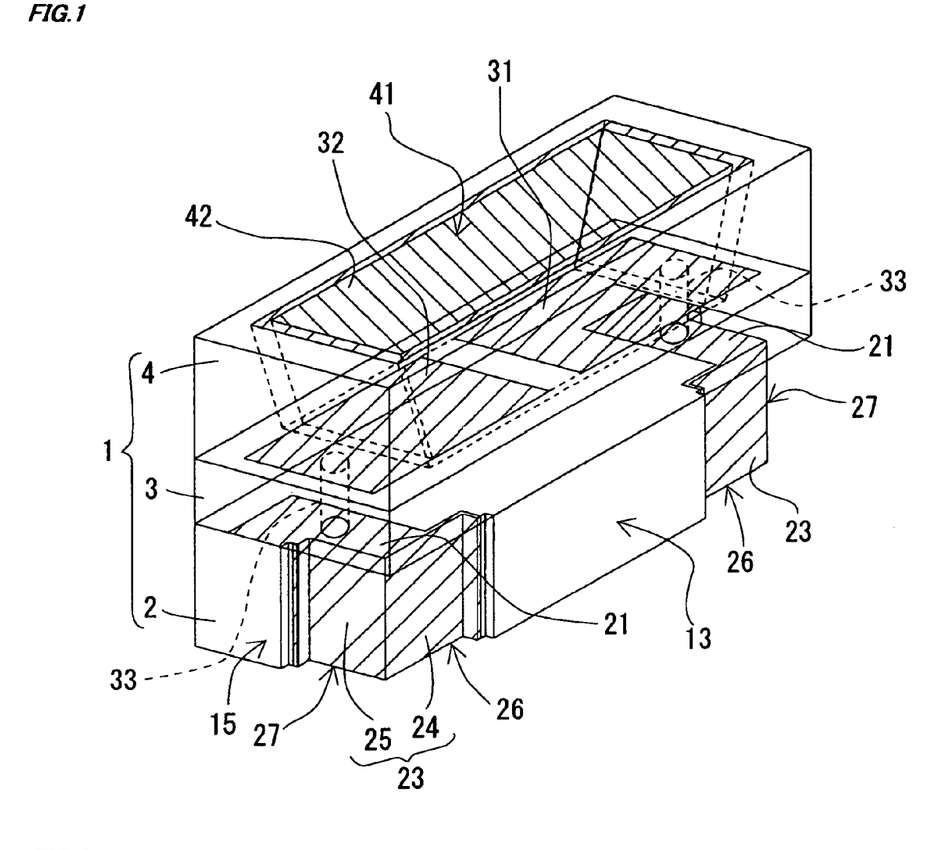
FIG. 1 is a transparent perspective view of a package of the present invention.
Figure 4:
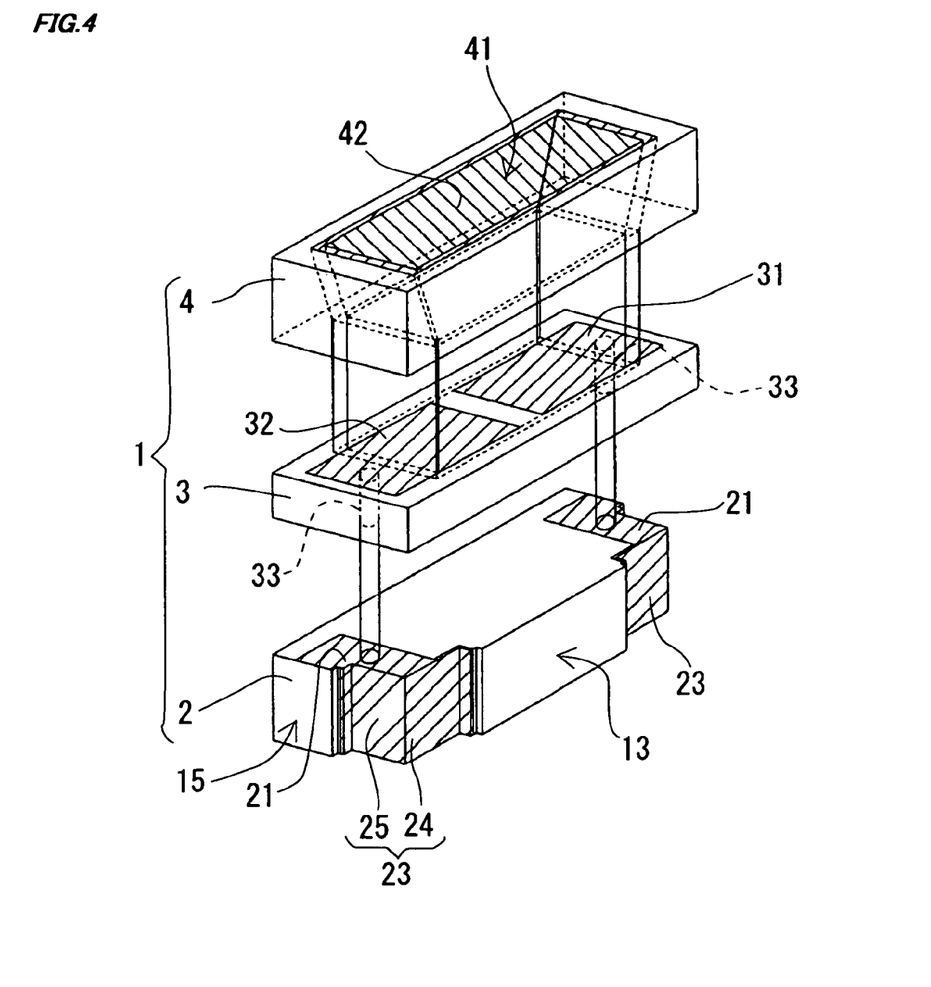
FIG. 4 is an exploded perspective view of the package.

As shown in FIG. 1 and FIG. 4, the package 1 is formed by laminating a first ceramic layer 2, a second ceramic layer 3 and a third ceramic layer 4, and has a mount surface 13 to be a joint surface when mounted on the mother board 9, defined on a side surface parallel with the laminating direction. In a mounted state, a pair of side surfaces 15, 15 provided at both sides of the mount surface 13 will be perpendicular to the surface of the mother board 9.

The third ceramic layer 4 has a cavity 41 provided in the middle thereof. A reflection layer 42 made of silver is formed on the inner peripheral surface of the cavity 41. A first land layer 31 and a second land layer 32 made of silver are formed on a surface of the second ceramic layer 3 exposed from the cavity 41 of the third ceramic layer 4. The second ceramic layer 3 is also provided with two via hole portions 33, 33 penetrating perpendicularly thereto at positions corresponding to the two land layers 31, 32, respectively.

Two electrode joint layers 21, 21 made of silver are formed on a surface of the first ceramic layer 2 at positions corresponding to the two via hole portions 33, 33, respectively, of the second ceramic layer 3. The first ceramic layer 2 also has defined at each end thereof an L-shaped recess including a first recess 26 and a second recess 27 across the mount surface 13 and the side surface 15. Formed on the L-shaped recess is an external electrode 23 including a first electrode layer 24 and a second electrode layer 25. External electrodes 23 are connected to electrode joint layers 21, respectively. The first recess 26 has a depth greater than a thickness of the first electrode layer 24 (100 μm), while the second recess 27 has a depth greater than a thickness of the second electrode layer 25 (100 μm).

Figure 3:
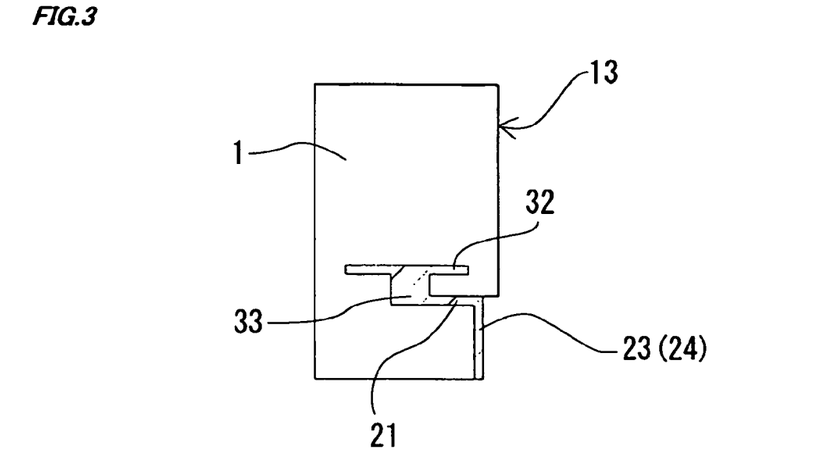
FIG. 3 is a longitudinal sectional view along A-A line in FIG. 2.

In this way, the first and second land layers 31, 32 of the package 1 connect to the respective external electrodes 23 via the via hole portion 33 and the electrode joint layer 21, as shown in FIG. 2 and FIG. 3.

As shown in FIG. 2, the light emitting element 11 is placed on the first land layer 31 exposed on the bottom surface of the cavity 41 of the package 1. A power supply terminal (not shown) provided on the top surface of the light emitting element 11 is connected to the second land layer 32 via a wire 12, while a ground terminal (not shown) provided on the reverse surface of the light emitting element 11 is connected to the first land layer 31. Therefore, the light emitting element 11 can be driven by connecting an external circuit to the pair of external electrodes 23, 23.

Figure 5:
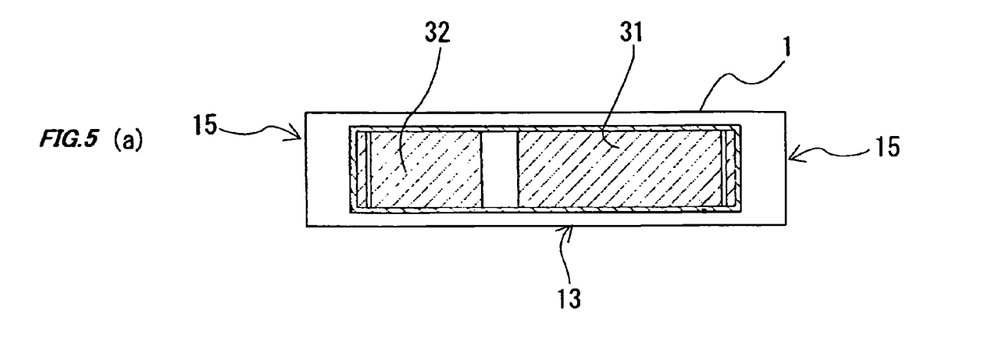

In the above-described light emitting device, as shown in FIG. 5(*a*), FIG. 5(*b*) and FIG. 5(*c*), the first electrode layers 24, 24 of the pair of external electrodes 23, 23 of the package 1 are exposed to the mount surface 13, while the second electrode layers 25, 25 are exposed to both the side surfaces 15, 15. The external electrode 23 is joined on the mother board 9 with a solder 91, as shown in FIG. 11, when the light emitting device is mounted on the mother board 9 by a solder reflow process.

The solder 91 will include a base portion 92 present between the first electrode layer 24 of the external electrode 23 and the surface of the mother board 9, and a fillet portion 93 formed along the second electrode layer 25 of the external electrode 23. Forming the first electrode layer 24 with sufficient width can provide a sufficiently high joint strength with the solder 91.

The package 1 of the above-described light emitting device is produced through a manufacturing process shown in FIG. 6 to FIG. 9. For convenience of illustration, the manufacturing process shown in FIG. 6 to FIG. 9 shows a process for producing four packages 1 at a time, but, practically, more packages 1 are produced at a time by a similar process.

Figure 6:
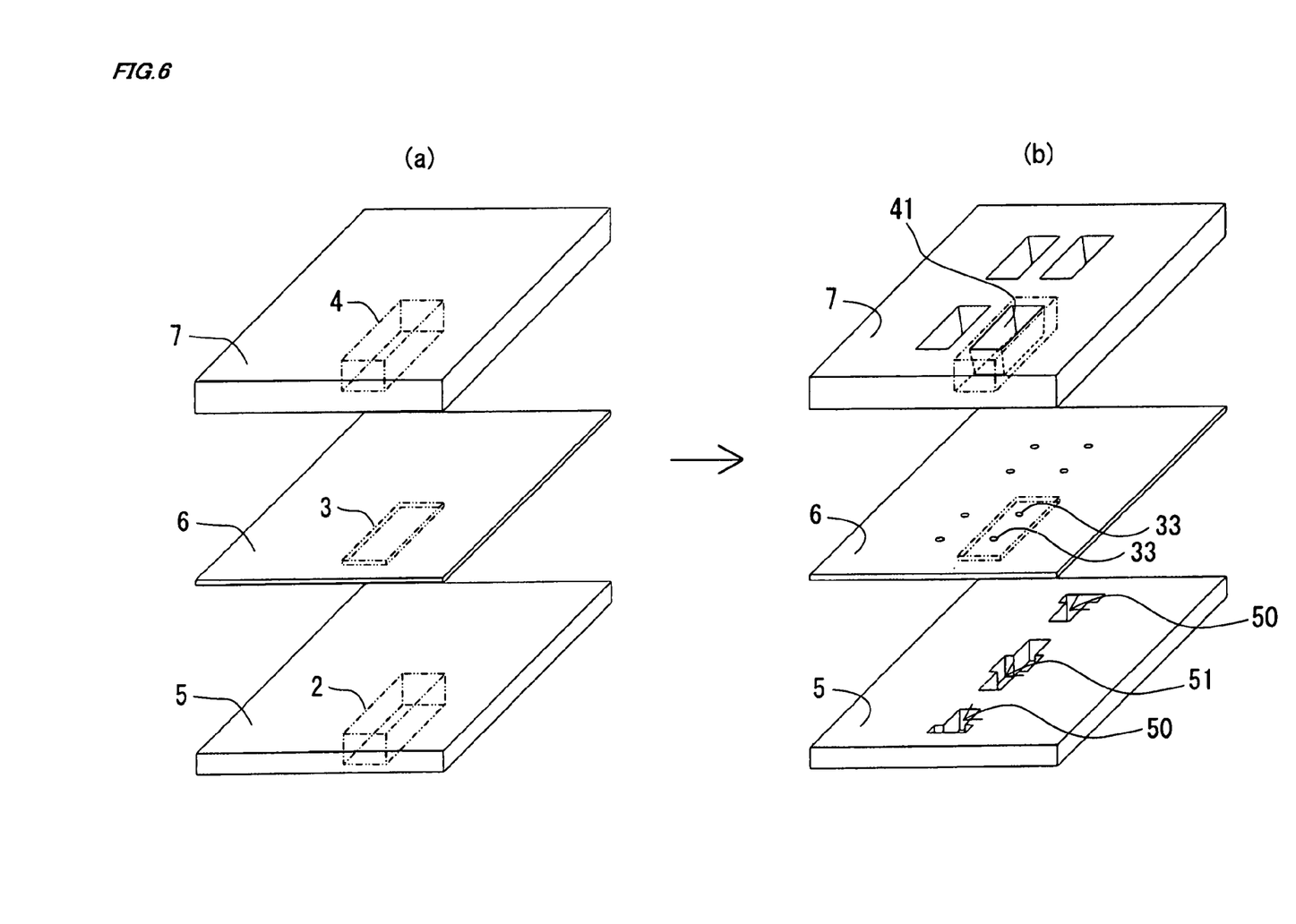
FIG. 6 represents a first step in a manufacturing process for the package.

First prepared as shown in FIG. 6(a) are a first green sheet 5 to be the first ceramic layer 2, a second green sheet 6 to be the second ceramic layer 3, and a third green sheet 7 to be the third ceramic layer 4. Next, as shown in FIG. 6(b), one cross-shaped groove 51 and two T-shaped grooves 50, 50 are provided on the first green sheet 5. Eight via hole portions 33-33 are formed on the second green sheet 6. Four cavities 41-41 are also provided on the third green sheet 7.

Figure 7:
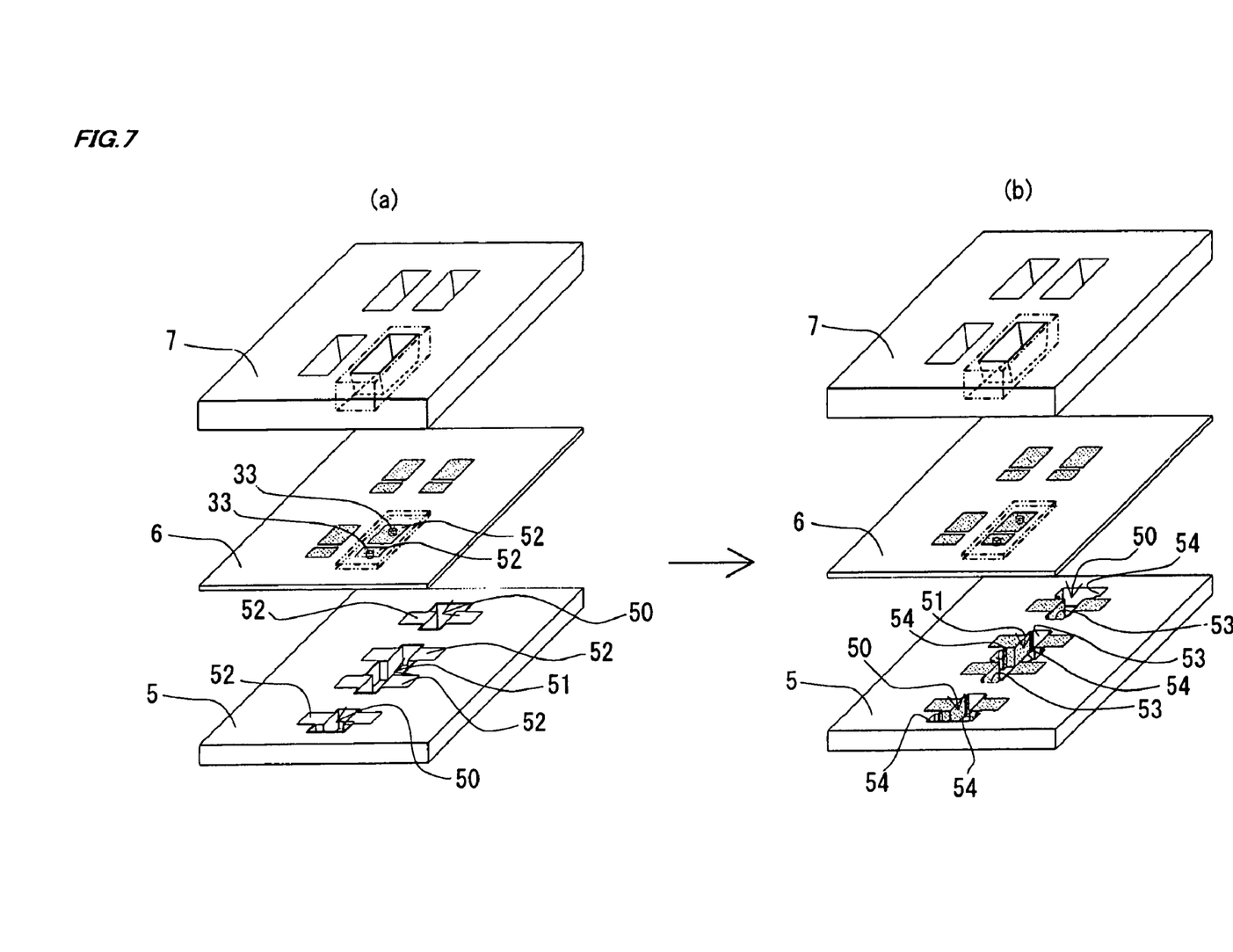
FIG. 7 represents a second step in the manufacturing process for the package.

Next, as shown in FIG. 7(a), silver pastes 52, 52, 52, 52 to be the electrode joint layer 21 and the external electrode 23 are printed, respectively, on a surface of the first green sheet 5 and inner walls of the cross-shaped groove 51 and the T-shaped grooves 50, 50. Silver pastes 52, 52 to be the land layers 31, 32 are also printed on a surface of the second green sheet 6, covering the via hole portions 33, 33, while silver pastes 52, 52 are charged in the via hole portions 33, 33. Silver pastes (not shown) are given also on cavity inner peripheral surfaces of the third green sheet 7.

Subsequently, as shown in FIG. 7(b), four U-shaped grooves 53, 53, 54, 54 further enlarging the groove depth in cross directions are provided for the cross-shaped groove 51 of the first green sheet 5, while three U-shaped grooves 53, 54, 54 further enlarging the groove depth in T directions are provided for each of the T-shaped grooves 50.

Figure 8A:
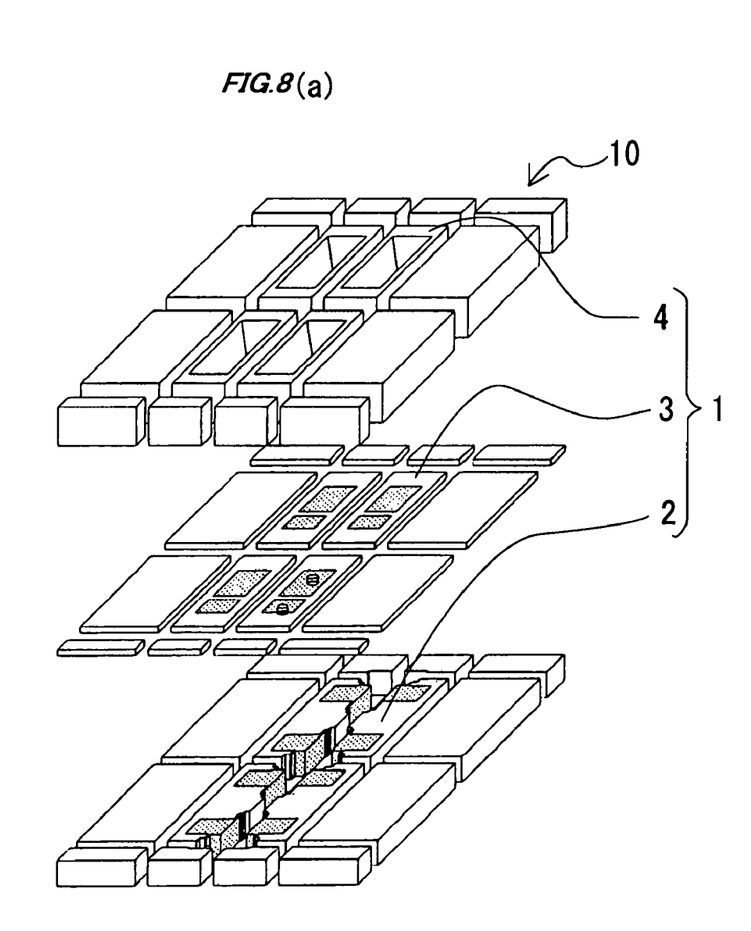
Figure 8B:
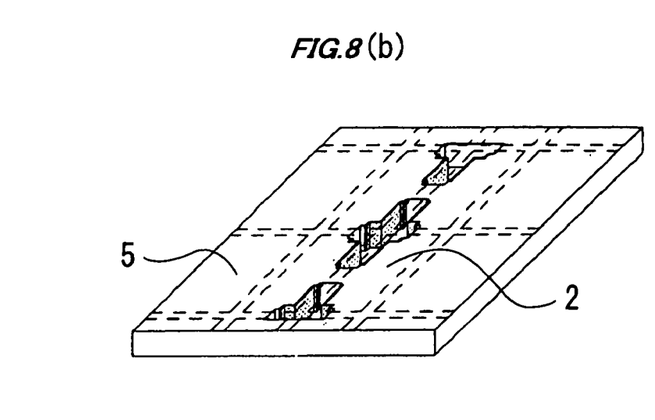
Figure 9:
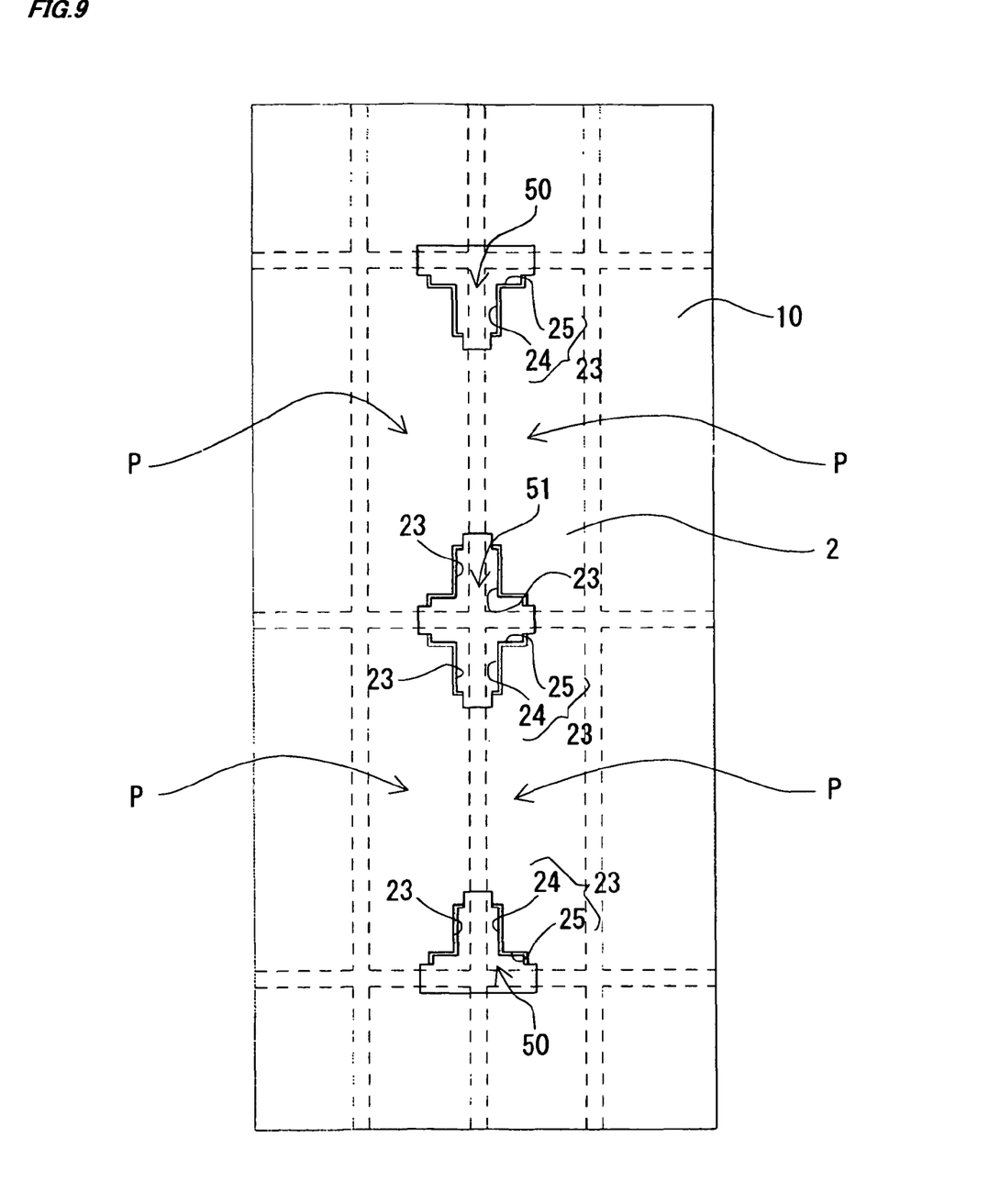
FIG. 9 is a reverse view of a package assembled substrate.

Thereafter, the first green sheet 5, the second green sheet 6 and the third green sheet 7 are laminated, and then pressure is applied thereto to provide a laminated body. Thereafter, the laminated body is fired to provide a package assembled substrate 10 shown in FIG. 8(a), FIG. 8(b) and FIG. 9. Then, the package assembled substrate 10 is cut along cutting lines indicated by broken lines. As a result, four packages 1, 1, 1, 1 will be obtained at a time. FIG. 9 shows the reverse surface of the package assembled substrate 10. FIG. 8(a) shows the structure of the package assembled substrate 10 after it is cut, with the first to third ceramic layers 2, 3, 4 being separated, and FIG. 8(b) shows the reverse surface of the first ceramic layer 2.

As shown in FIG. 9, in the package assembled substrate 10, each package part P in the form of a rectangular parallelepiped to be one package is arranged in the form of a matrix. The first ceramic layer 2 constituting each package part P is provided with the cross-shaped groove 51 extending along two orthogonal cutting lines around the intersection of the cutting lines, while the T-shaped groove 50 extending along cutting lines is provided at each intersection at both sides of the cross-shaped groove 51.

On the inner walls of the cross-shaped groove 51, the external electrode 23 including the first electrode layer 24 and the second electrode layer 25 made of silver is formed on each of four L-shaped recesses surrounding the intersection. On the inner walls of the T-shaped groove 50, the external electrode 23 including the first electrode layer 24 and the second electrode layer 25 is formed on each of two L-shaped recesses.

When attention is drawn to any one of package parts P, it is noted that an L-shaped recess is defined at each end of the package part P in a direction perpendicular to the laminating direction, opposed to two neighboring package parts in two directions, and that an external electrode 23 is formed on the L-shaped recess.

Figure 10:
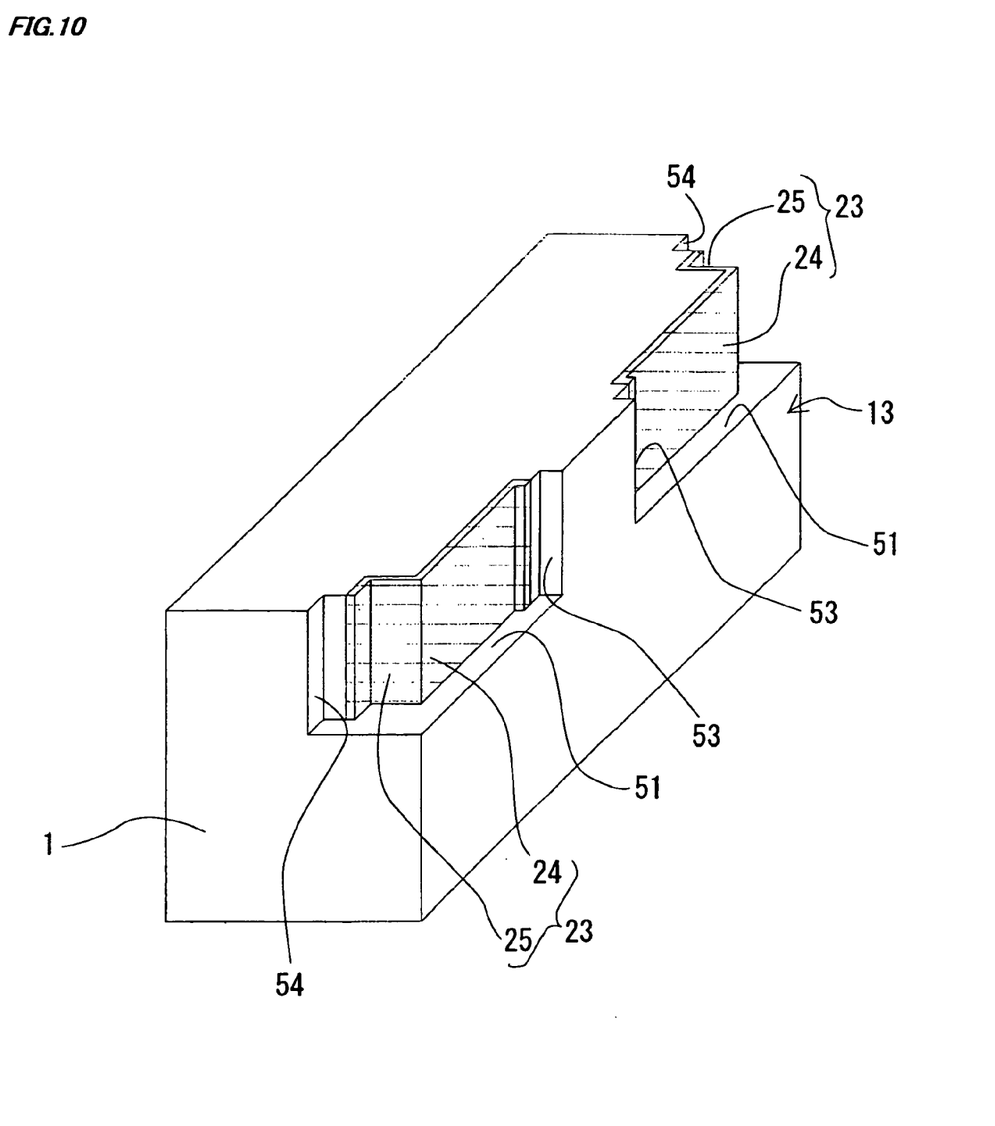
FIG. 10 is a perspective view showing an electrode structure of the package.

Four packages 1 of the present invention shown in FIG. 10 are obtained at a time by cutting the package assembled substrate 10 with a dicer along cutting lines indicated by broken lines shown in FIG. 9. Because the cutting lines extend apart from the external electrode 23, the external electrode 23 is not cut by the dicer, and the surface of the external electrode 23 is maintained to be flat.

Therefore, a strong joint structure with the solder 91 including the base portion 92 and the fillet portion 93 can be obtained by mounting the package 1 on the mother board 9 as shown in FIG. 11. Furthermore, a position shift of the package 1 during a solder reflow process can be prevented by forming the first electrode layer 24 of the external electrode 23 with a sufficient width (i.e. 300 μm×500 μm).

What is claimed is:

1. An electronic component mounting package having a laminate structure formed by laminating a plurality of ceramic layers, comprising
    a component mounting surface for mounting at least one electronic component, defined perpendicularly to a laminating direction;
    a mount surface to be a joint surface when mounted on a mother board, defined parallel with the laminating direction;
    a recess with an L-shaped cross section across the mount surface and a side surface perpendicular to the mount surface, defined at each end of at least one ceramic layer of the plurality of ceramic layers in a direction perpendicular to the laminating direction; and
    an external electrode for connecting the electronic component to the mother board, formed on each recess, the external electrode having a surface thereof exposed to the mount surface, the external electrode being entirely non-flush with the mount surface.

2. The electronic component mounting package according to claim 1, wherein each recess has a depth greater than a thickness of the external electrode.

3. The electronic component mounting package according to claim 1, wherein the external electrode has a width corresponding to a thickness of the one ceramic layer.

4. The electronic component mounting package according to claim 1, wherein each external electrode comprises a first electrode layer expanding parallel with the mount surface in a predetermined depth from the mount surface, and a second electrode layer expanding parallel with the side surface in a predetermined depth from the side surface.

5. A package assembled substrate having a plurality of electronic component mounting packages to be cut out therefrom, the package assembled substrate comprising a laminate structure formed by laminating a plurality of ceramic layers, and an assembled structure in which each package part in the form of a rectangular parallelepiped to be one electronic component mounting package is arranged in the form of a matrix, wherein each package part has a component mounting surface for mounting at least one electronic component, defined perpendicularly to a laminating direction; a recess with an L-shaped cross section perpendicular to the laminating direction, defined at each end of at least one ceramic layer of a plurality of ceramic layers constituting one package part in a direction perpendicular to the laminating direction, opposed to two neighboring package parts in two directions; and an external electrode for connecting the electronic component to a mother board, formed on each recess, wherein a plurality of package parts can be cut out by cutting along a cutting line separate from the external electrode.

6. A package assembled substrate having a plurality of electronic component mounting packages to be cut out therefrom, the package assembled substrate comprising a laminate structure formed by laminating a plurality of ceramic layers, and an assembled structure in which each package part in the form of a rectangular parallelepiped to be one electronic component mounting package is arranged in the form of a matrix, wherein each package part has a component mounting surface for mounting at least one electronic component, defined perpendicularly to a laminating direction; a recess with an L-shaped cross section perpendicular to the laminating direction, defined at each end of at least one ceramic layer of a plurality of ceramic layers constituting one package part in a direction perpendicular to the laminating direction, opposed to two neighboring package parts in two directions; and an external electrode for connecting the electronic component to a mother board, formed on each recess, wherein a plurality of package parts can be cut out by cutting along a cutting line separate from the external electrode;

wherein each recess has a depth greater than a thickness of the external electrode.

7. The package assembled substrate according to claim 5, wherein at least one ceramic layer of a plurality of ceramic layers constituting four package parts assembled around an intersection of two orthogonal cutting lines is provided with a cross-shaped groove extending from the intersection along the two cutting lines, and the cross-shaped groove defines L-shaped recesses of the four package parts.

* * * * *